(12) United States Patent
Huang et al.

(10) Patent No.: US 11,881,459 B2
(45) Date of Patent: Jan. 23, 2024

(54) ELECTRONIC PACKAGE AND FABRICATION METHOD THEREOF

(71) Applicant: SILICONWARE PRECISION INDUSTRIES CO., LTD., Taichung (TW)

(72) Inventors: Yu-Lung Huang, Taichung (TW); Chee-Key Chung, Taichung (TW); Yuan-Hung Hsu, Taichung (TW); Chi-Jen Chen, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 228 days.

(21) Appl. No.: 16/867,937

(22) Filed: May 6, 2020

(65) Prior Publication Data

US 2021/0082837 A1 Mar. 18, 2021

(30) Foreign Application Priority Data

Sep. 16, 2019 (TW) .................................. 108133228

(51) Int. Cl.
*H01L 23/00* (2006.01)
*H01L 21/768* (2006.01)
*H01L 23/538* (2006.01)

(52) U.S. Cl.
CPC ...... *H01L 23/562* (2013.01); *H01L 21/76804* (2013.01); *H01L 23/5384* (2013.01); *H01L 23/5386* (2013.01)

(58) Field of Classification Search
CPC ... H01L 23/562; H01L 21/56; H01L 23/3135; H01L 21/563; H01L 25/072
See application file for complete search history.

(56) References Cited

U.S. PATENT DOCUMENTS

| | | | |
|---|---|---|---|
| 9,607,951 B2* | 3/2017 | Ko | H01L 23/16 |
| 9,633,869 B2* | 4/2017 | Chiu | H01L 21/4853 |
| 9,875,949 B2* | 1/2018 | Huang | H01L 23/481 |
| 11,398,413 B2* | 7/2022 | Chang | H01L 23/3178 |
| 11,532,528 B2* | 12/2022 | Chen | H01L 23/49816 |
| 11,610,850 B2* | 3/2023 | Hsu | H01L 25/0655 |
| 2003/0219969 A1* | 11/2003 | Saito | H01L 21/6835 |
| | | | 257/E21.705 |
| 2007/0045829 A1* | 3/2007 | Jeong | H01L 23/552 |
| | | | 257/E23.125 |
| 2010/0308474 A1* | 12/2010 | Shibuya | H01L 21/565 |
| | | | 257/E21.511 |
| 2011/0221053 A1* | 9/2011 | Chandrasekaran | H01L 24/94 |
| | | | 257/E23.141 |
| 2015/0130055 A1* | 5/2015 | Lin | H01L 24/14 |
| | | | 257/737 |

(Continued)

*Primary Examiner* — Bac H Au
(74) *Attorney, Agent, or Firm* — Kelly & Kelley, LLP (57) ABSTRACT

An electronic package is provided and includes a plurality of electronic elements, a spacing structure connecting each of the plurality of electronic elements, and a plurality of conductive elements electrically connected to the plurality of electronic elements and serving as external contacts. The spacing structure has a recess to enhance the flexibility of the electronic elements after the electronic elements are connected to one another, thereby preventing the problem of warpage. A method for fabricating the electronic package is also provided.

11 Claims, 7 Drawing Sheets

(56) References Cited

U.S. PATENT DOCUMENTS

| | | | |
|---|---|---|---|
| 2015/0171024 A1* | 6/2015 | Choi | H01L 23/481 |
| | | | 257/774 |
| 2015/0221611 A1* | 8/2015 | Jeng | H01L 23/60 |
| | | | 257/770 |
| 2015/0287697 A1* | 10/2015 | Tsai | H01L 24/97 |
| | | | 257/773 |
| 2016/0141255 A1* | 5/2016 | Lu | H01L 23/147 |
| | | | 257/737 |
| 2016/0340175 A1* | 11/2016 | Jiang | B81B 7/0048 |
| 2017/0213809 A1* | 7/2017 | Lu | H01L 24/97 |
| 2019/0181021 A1* | 6/2019 | Wang | H01L 21/56 |
| 2021/0035859 A1* | 2/2021 | Mehta | H01L 21/76804 |
| 2022/0165635 A1* | 5/2022 | Park | H01L 21/486 |
| 2022/0319944 A1* | 10/2022 | Park | H01L 24/92 |

\* cited by examiner

ELECTRONIC PACKAGE AND FABRICATION METHOD THEREOF

CROSS-REFERENCE TO RELATED APPLICATIONS

This application claims priority to Taiwan Application Serial No. 108133228, filed on Sep. 16, 2019. The entirety of the above-mentioned patent application is hereby incorporated by reference herein and made a part of this specification.

BACKGROUND

1. Technical Field

The present disclosure relates to semiconductor devices, and more particularly, to an electronic package and a fabrication method thereof capable of improving the reliability.

2. Description of Related Art

Along with the progress of technology, the demand for electronic products with heterogeneous integration has increased. Therefore, multi-chip packaging structures (MCM/MCP) have been developed.

Figure 1:
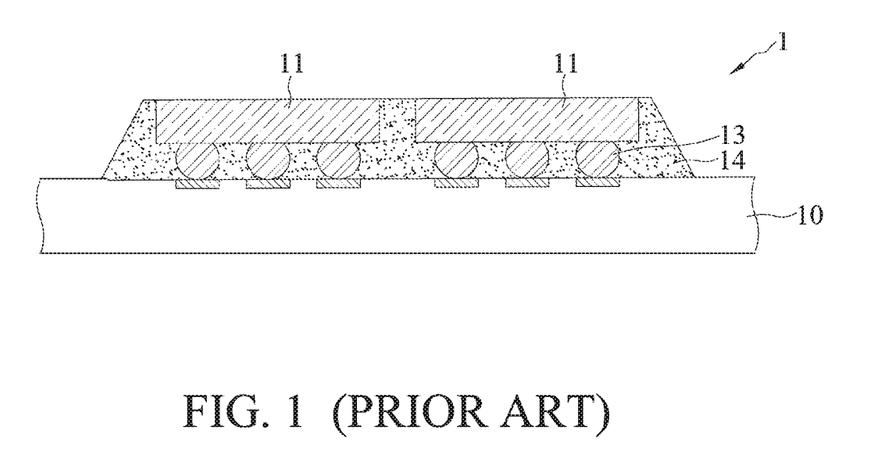
FIG. 1 is a schematic cross-sectional view of a conventional multi-chip packaging structure.

As shown in multi-chip packaging structure 1 of FIG. 1, a plurality of semiconductor chips 11 are bonded to a packaging substrate 10 through a plurality of solder bumps 13 and a packaging material 14 is formed to encapsulate the plurality of semiconductor chips 11. By packaging the plurality of semiconductor chips into a single packaging structure, more I/O counts can be provided, the computing power of processors can be greatly increased and signal transmission delay can be reduced. Therefore, such a packaging structure is applicable to high-end products with high-density circuits, a high transmission speed, a large number of stack layers or a large size design.

However, the diversification of product functions makes the packaging structure more complicated, and when the complicated packaging structure is implemented in a smaller volume, the packaging structure becomes more fragile. The packaging structure is more prone to failure when warpage or other deformation occurs. Further, since a plurality of semiconductor chips are arranged on a substrate, as the requirement of specifications varies over time, the size of the overall packaging structure is becoming larger and larger. Therefore, problems such as delamination and ball or chip cracking that are caused by warpage are becoming more and more serious.

Therefore, how to overcome the above-described drawbacks of the prior art has become an urgent issue in the art.

SUMMARY

In view of the above-described drawbacks, the present disclosure provides an electronic package, which comprises: a plurality of electronic elements; a spacing structure formed between and connecting any adjacent two of the plurality of electronic elements, wherein the spacing structure is formed with a recess; and a plurality of conductive elements electrically connected to the plurality of electronic elements and serving as external contacts.

The present disclosure further provides a method for fabricating an electronic package, which comprises: providing a plurality of electronic elements; forming a spacing structure between any adjacent two of the plurality of electronic elements for connecting the adjacent two of the electronic elements; forming a recess on the spacing structure; and providing a plurality of conductive elements, wherein the plurality of conductive elements are electrically connected to the plurality of electronic elements to serve as external contacts.

The above-described electronic package and fabrication method thereof further comprise a carrier structure having two opposite sides, wherein one of the two opposite sides of the carrier structure carries is electrically connected to the plurality of electronic elements, and the plurality of conductive elements are disposed on the other one of the two opposite sides of the carrier structure. For example, the carrier structure is in the form of a single carrier board or in the form of multiple carrier boards. Further, a filling material is formed between the plurality of electronic elements and the carrier structure, and the filling material further constitutes the spacing structure.

The above-described electronic package and fabrication method thereof further comprise an encapsulant encapsulating the plurality of electronic elements, wherein the encapsulant further constitutes the spacing structure.

In the above-described electronic package and fabrication method thereof, each of the electronic elements has an active surface, an inactive surface opposite to the active surface, and a side surface adjacent to and connecting the active surface and the inactive surface, and the spacing structure connects the side surfaces of the plurality of electronic elements.

In the above-described electronic package and fabrication method thereof, the spacing structure comprises a plurality of materials.

In the above-described electronic package and fabrication method thereof, the recess has an inclined surface formed on a top wall thereof. Further, the inclined surface extends to the adjacent two of the electronic elements.

The above-described electronic package and fabrication method thereof further comprise a heat dissipation element bonded onto the plurality of electronic elements, wherein the heat dissipation element covers the recess. Further, the heat dissipation element is bonded onto the plurality of electronic elements through a bonding layer. For example, the bonding layer is partially filled in the recess.

Therefore, by forming a recess on a spacing structure between adjacent two of the plurality of electronic elements, the present disclosure improves the flexibility of the electronic elements after the electronic elements are connected to one another. Compared with the prior art, the present disclosure can compensate for thermal variation in subsequent packaging processes and prevent the problem of warpage.

BRIEF DESCRIPTION OF THE DRAWINGS

FIG. 2C' is a schematic cross-sectional view illustrating another embodiment of FIG. 2C;

FIG. 2E' is a partially enlarged schematic cross-sectional view of FIG. 2E;

DETAILED DESCRIPTION

The following illustrative embodiments are provided to illustrate the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms, such as "first," "second," "on," "a," etc., are merely for illustrative purposes and should not be construed to limit the scope of the present disclosure.

FIGS. 2A to 2E are schematic cross-sectional views illustrating a method for fabricating an electronic package 2 according to the present disclosure.

Figure 2A:
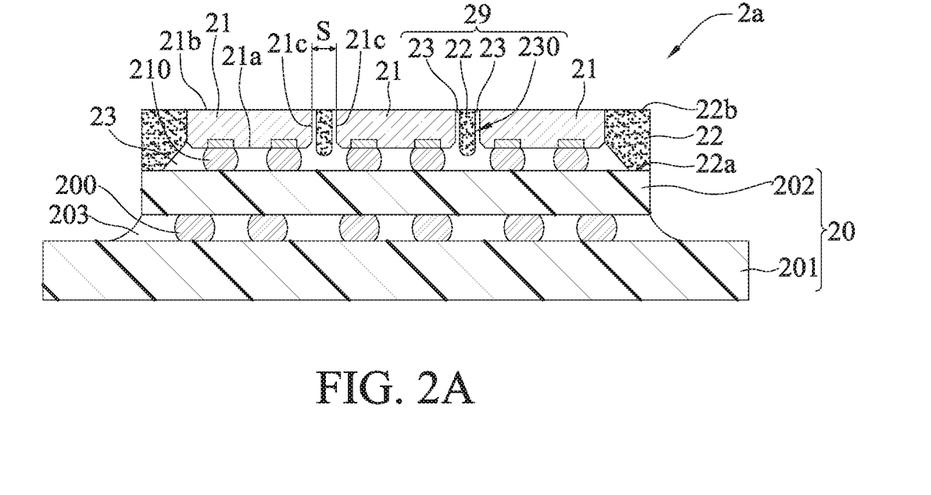
FIGS. 2A to 2E are schematic cross-sectional views illustrating a method for fabricating an electronic package according to the present disclosure.

As shown in FIG. 2A, a multi-chip packaging body 2a is provided, which includes a carrier structure 20, a plurality of electronic elements 21, and an encapsulant 22.

Figure 4:
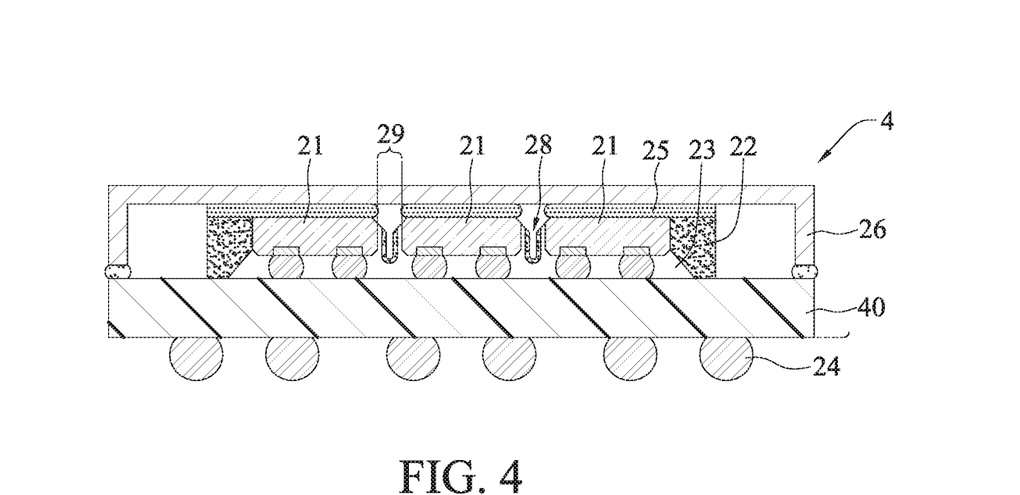
FIGS. 4 and 5 are schematic cross-sectional views illustrating different embodiments of the electronic package according to the present disclosure.

The carrier structure 20 is in the form of multiple carrier boards 201, 202 that are electrically stacked on one another through a plurality of conductors 200 (can be encapsulated by an underfill 203). Alternatively, the carrier structure 20 can be in the form of a single carrier board (e.g., the carrier structure 40 shown in FIG. 4 is a packaging substrate). In an embodiment, multiple carrier boards are used for illustrative purposes. The carrier board is, for example, a packaging substrate having a core layer and a circuit structure, a packaging substrate having a coreless circuit structure, a through silicon interposer (TSI) having through silicon vias (TSVs), and so on. The carrier board has at least an insulating layer and at least a circuit layer such as a fan-out redistribution layer bonded to the insulating layer. Also, the carrier structure 20 can be, for example, a lead frame, a wafer, or a board having metal routing. It should be noted that the above-described examples are only for illustrative purposes and the carrier structure 20 is not limited thereto.

In an embodiment, the carrier board of the carrier structure 20 can be fabricated through various processes. For example, a circuit layer is fabricated through a wafer fabrication process, and silicon nitride or silicon oxide is formed by chemical vapor deposition (CVD) as an insulating layer. Alternatively, a circuit layer is formed through a common non-wafer fabrication process, and a low-cost polymer dielectric material such as polyimide (PI), polybenzoxazole (PBO), prepreg (PP), a molding compound, a photosensitive dielectric layer or the like is formed by coating as an insulating layer.

Figure 2B:
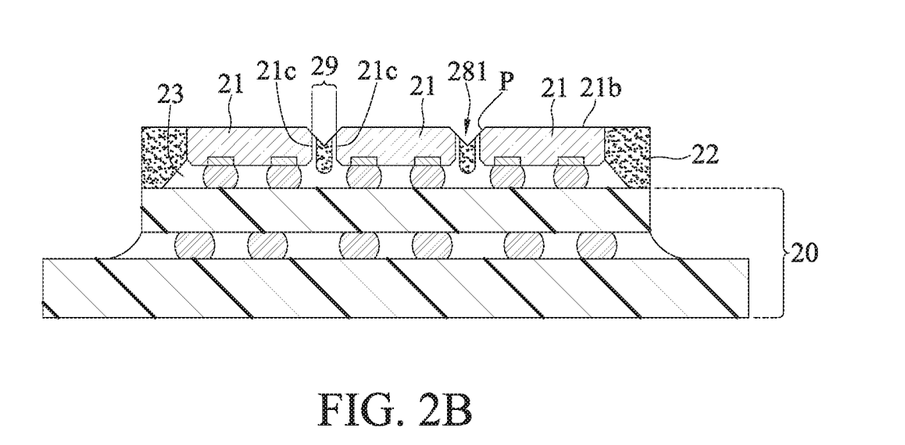
Figure 2C:
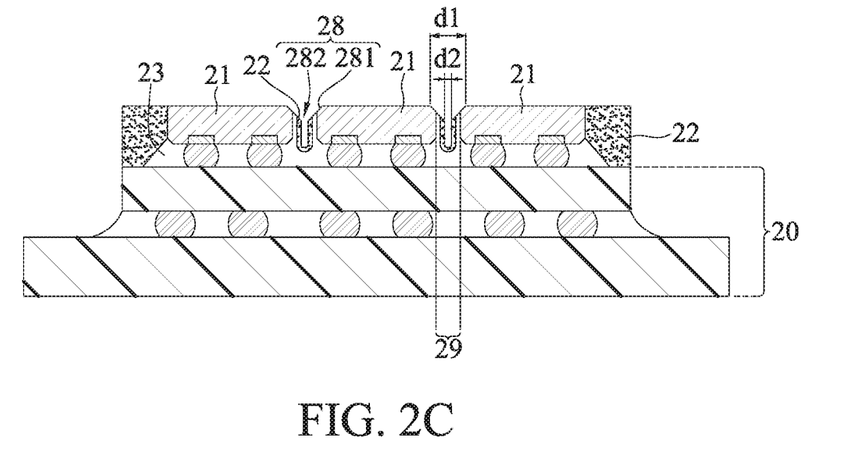
Figure 2D:
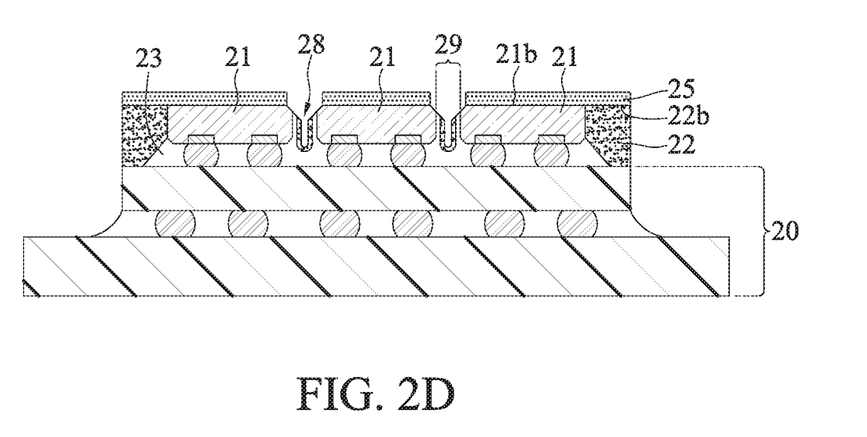
Figure 2E:
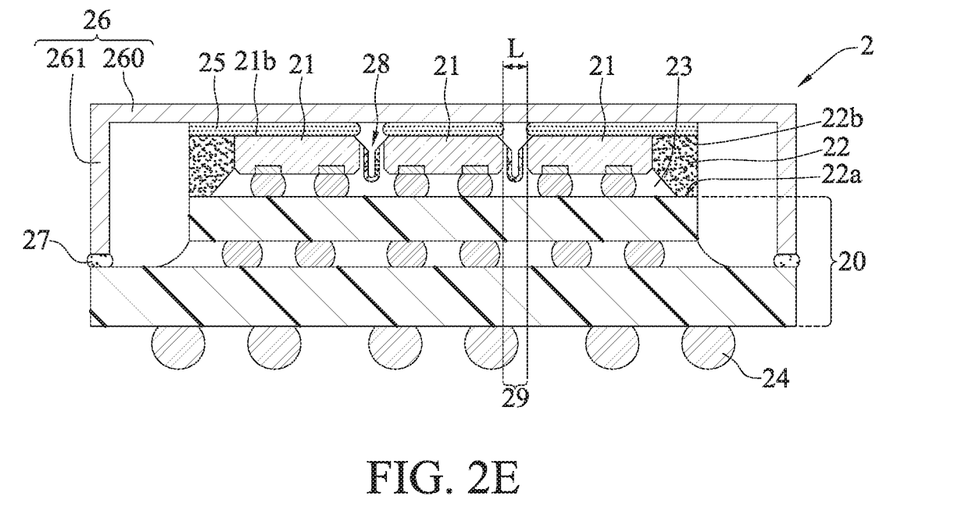

Further, in a subsequent process, a plurality of conductive elements 24 (as shown in FIG. 2E) can be formed on a lower side of the carrier structure 20 to serve as external contacts for connecting with an electronic device such as a circuit board (not shown). The conductive elements 24 can be, for example, metal posts such as copper posts, metal bumps encapsulating insulating blocks, solder balls, solder balls having copper core, or the like.

The plurality of electronic elements 21 are arranged separately from one another on an upper side of the carrier structure 20.

The electronic element 21 is an active element such as a semiconductor chip, a passive element such as a resistor, a capacitor or an inductor, or a combination thereof. In an embodiment, the electronic element 21 is a semiconductor chip, which has an active surface 21a with a plurality of electrode pads, an inactive surface 21b opposite to the active surface 21a, and a side surface 21c adjacent to and connecting the active surface 21a and the inactive surface 21b. The electrode pads of the active surface 21a are disposed on the carrier structure 20 in a flip-chip manner and electrically connected to the circuit layer of the carrier structure 20 through a plurality of conductive bumps 210. The conductive bumps 210 are made of such as a solder material, metal pillars or the like. Further, a filling material 23 is formed to encapsulate the conductive bumps 210. In another embodiment, the electronic element 21 can be electrically connected to the circuit layer of the carrier structure 20 through a plurality of bonding wires (not shown) in a wire-bonding manner. In a further embodiment, the electronic element 21 can be in direct contact with the circuit layer of the carrier structure 20. Therefore, the electronic elements with required types and quantities can be disposed on the carrier structure 20 so as to improve the electrical performance thereof. The manner in which the electronic elements 21 electrically connect the carrier structure 20 can be varied without being limited to above-described examples.

The filling material 23 is formed between the carrier structure 20 and the electronic elements 21 for encapsulating the conductive bumps 210. In an embodiment, the filling material 23 is, for example, an underfill, which is further formed in a gap S between adjacent two of the electronic elements 21. The filling material 23 extends onto the side surfaces 21c of the electronic elements 21 due to a capillary effect.

Further, at least one recess 230 is formed on the filling material 23 in the gap S. For example, the filling material 23 is partially removed by cutting, laser ablation or etching so as to form the recess 230. The recess 230 can have a constant or non-constant width from top to bottom. The recess 230 can have, but not limited to, a cone shape or a funnel shape.

The encapsulant 22 is formed on the carrier structure 20 and in the recess 230 to encapsulate the electronic elements 21 and the filling material 23.

In an embodiment, the encapsulant 22 has a first surface 22a bonded to the carrier structure 20 and a second surface 22b opposite to the first surface 22a. The inactive surfaces 21b of the electronic elements 21 are flush with the second surface 22b of the encapsulant 22 and hence the electronic elements 21 are exposed from the second surface 22b of the encapsulant 22.

Further, the encapsulant 22 is made of an insulating material, such as polyimide or epoxy, which is formed by molding, lamination or coating to fill the recess 230. As such, a spacing structure 29 is formed between at least adjacent two of the electronic elements 21. The spacing structure 29 comprises a plurality of materials, such as the insulating materials of the encapsulant 22 and the filling material 23.

Figure 3A:
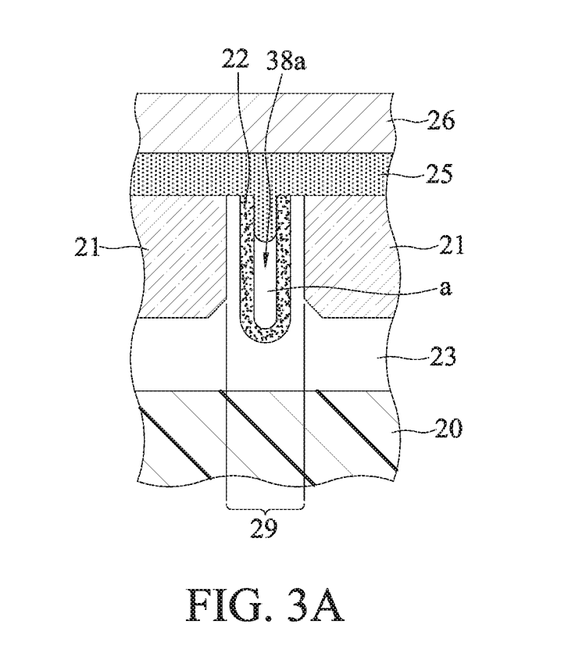
FIGS. 3A to 3C are partially enlarged schematic cross-sectional views illustrating different aspects of spacing structures of the electronic package according to the present disclosure.
Figure 3B:
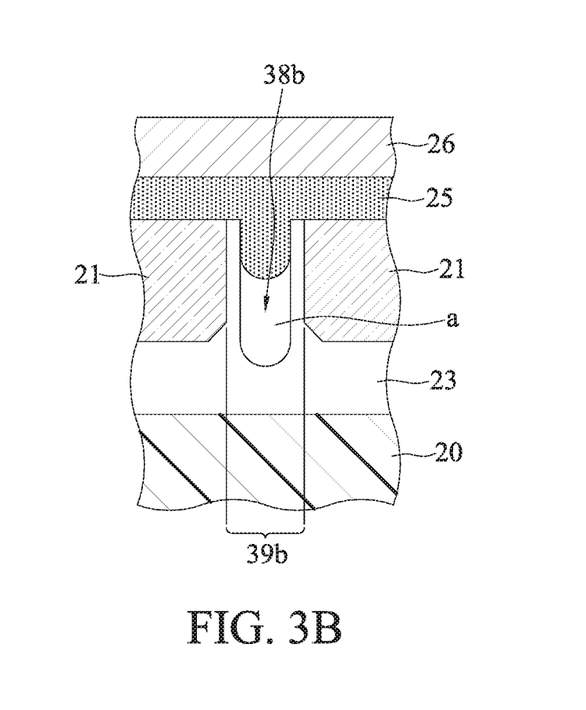
Figure 3C:
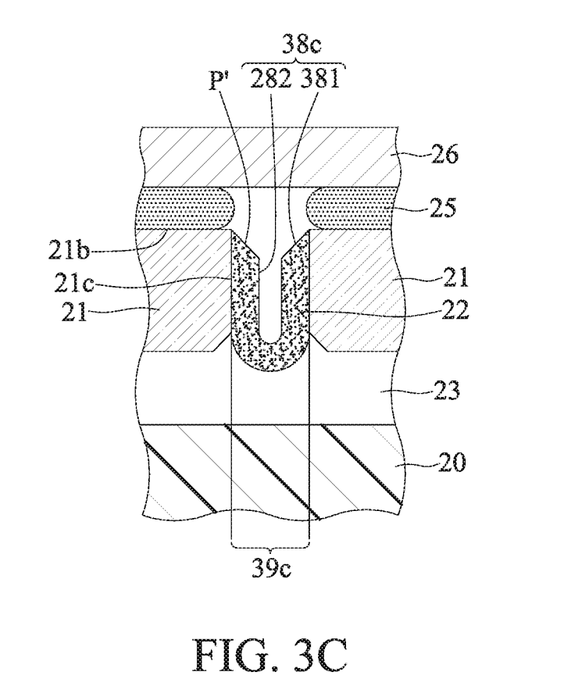

Referring to FIGS. 3B and 3C, in other embodiments, the spacing structures 39b, 39c can be made of a single material. For example, the spacing structure 39b of FIG. 3B is made of the filling material 23, and the spacing structure 39c of FIG. 3C is made of the encapsulant 22. Further, according to the practical need, the spacing structure can be arranged with a metal material to serve as a shielding layer of the electronic elements 21.

Furthermore, the spacing structure 29 is connected between the adjacent electronic elements 21, such that the adjacent electronic elements 21 are connected to each other.

As shown in FIG. 2B, at least one first opening 281 is formed on the spacing structure 29.

In an embodiment, a half-cutting process is performed by cutting, laser ablation or etching so as to partially remove the encapsulant 22 and the filling material 23, thereby forming the first openings 281. After the half-cutting process, the side surfaces 21c of the plurality of electronic elements 21 still retain the spacing structures 29.

Further, the walls of the first openings 281 are inclined surfaces P extending to the connection edges of the inactive surfaces 21b and the side surfaces 21c of the electronic elements 21 so as to form chamfers. In another embodiment, as shown in recess 38c of FIG. 3C, the inclined surfaces P' of the first opening 381 do not extend to the electronic elements 21 and hence the connection edges of the inactive surfaces 21b and the side surfaces 21c of the electronic elements 21 are still sharp angles, such as right angles.

As shown in FIG. 2C, continued from FIG. 2B, at least one second opening 282 is formed from the first opening 281 on the encapsulant 22 of the spacing structure 29. As such, the first and second openings 281, 282 form a recess 28.

In an embodiment, a half-cutting process is performed by cutting, laser ablation or etching so as to partially remove the material of the encapsulant 22, thereby forming the second openings 282. The second openings 282 do not penetrate through the encapsulant 22 of the spacing structures 29.

Further, as shown in FIGS. 2C and 3C, the fabrication processes of the recesses 28, 38c comprise multiple half-cutting processes that form the first openings and the second openings, respectively. Further, the second half-cutting process forms the second openings 282 with flat and straight sidewalls. Alternatively, as shown in FIGS. 3A and 3B, a single half-cutting process is performed to form the recesses 38a, 38b.

In addition, through the design of the width d1 of the first openings 281, 381 that is greater than the width d2 of the second openings 282 and the design of the inclined surfaces of the first openings 281, 381, the first openings 281 can be used as an alignment reference in the fabrication process so as to facilitate the formation of the second openings 282.

Further, as shown in FIG. 2C', before performing the fabrication process of the recess 28, the carrier structure 20 can be arranged with an interposer type carrier board 202, and after the fabrication process of the recess 28, the interposer type carrier board 202 is electrically stacked on a packaging substrate type carrier board 201 through a plurality of conductors 200 (can be encapsulated by an underfill 203). As such, the multiple carrier boards 201, 202 are electrically stacked on one another to constitute the carrier structure 20, as shown in FIG. 2C.

As shown in FIG. 2D, a bonding layer 25 is formed on the inactive surfaces 21b of the electronic elements 21 and the second surface 22b of the encapsulant 22 while exposing the recess 28.

In an embodiment, the bonding layer 25 is made of a liquid heat dissipation adhesive material and used as a thermal interface material (TIM).

As shown in FIGS. 2E and 2E', a heat dissipation element 26 is disposed on the inactive surfaces 21b of the plurality of electronic elements 21 through the bonding layer 25 and then the bonding layer 25 is thermally cured. Thereafter, a plurality of conductive elements 24 are formed on a lower side of the carrier structure 20 and electrically connected to the carrier structure 20.

In an embodiment, the heat dissipation element 26 has a heat dissipation body 260 and a plurality of support legs 261 disposed on the lower side of the heat dissipation body 260. The heat dissipation body 260 is in the form of a heat sink and the lower side thereof is in contact with the bonding layer 25. The support legs 261 are bonded onto the carrier structure 20 through an adhesive layer 27.

Further, the inclined surfaces P, P' of the first openings 281, 381 facilitate to increase the distance L between the bonding layer 25 of the adjacent electronic elements 21. As such, after lamination of the heat dissipation body 260, the bonding layer 25 is respectively arranged on each of the electronic elements 21 without being combined into a large-area sheet body (which may affect the flexibility of the electronic package 2). It should be noted that the usage of the bonding layer 25 needs to be adjusted so as to prevent the bonding layer 25 from being combined into a large-area sheet body while the recesses 38a, 38b are fabricated through a single half-cutting process.

Furthermore, as shown in FIGS. 3A and 3B, if the bonding layer 25 is partially filled in the recesses 38a, 38b when being pressed by the heat dissipation element 26, the bonding layer 25 can serve as a thermal deformation or displacement suppressing layer for the electronic elements 21 so as to prevent the adjacent electronic elements 21 from coming into direct contact.

Figure 5:
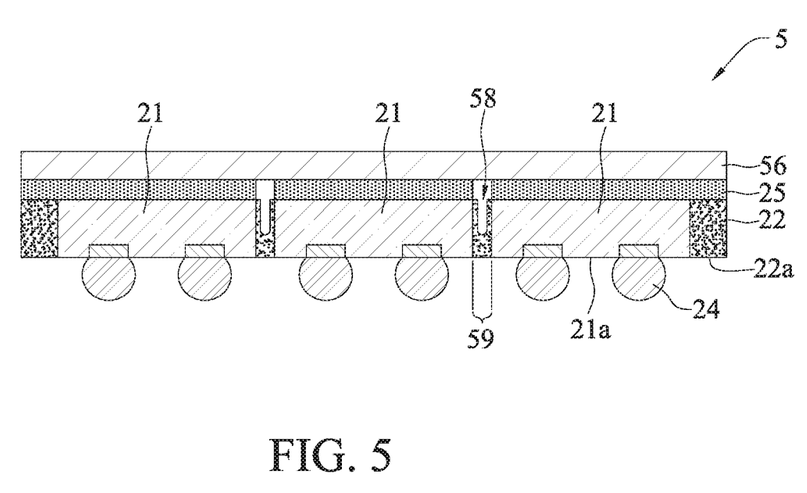

In addition, the electronic package 2 of the present disclosure is not limited to the above-described examples. For example, FIG. 5 shows an electronic package 5 in the form of a wafer level chip scale package. Therein, on the active surfaces 21a of the plurality of electronic elements 21 embedded in the encapsulant 22, a plurality of conductive elements 24 are formed and protruded from a first surface 22a of the encapsulant 22 so as to serve as external contacts for connecting with an electronic device such as a circuit board (not shown). The spacing structure 59 is made of a single material. The recess 58 is fabricated through a single half-cutting process. The heat dissipation element 56 is in the form of a heat sink.

Therefore, by forming the recesses 28, 38a, 38b, 38c, 58 on the spacing structures 29, 39b, 39c, 59 between the adjacent two of the plurality of electronic elements 21, the present disclosure improves the flexibility of the electronic elements 21 after the electronic elements 21 are connected to one another. Therefore, the present disclosure can compensate for thermal variation in subsequent packaging processes and prevent warpage.

Further, the design of the inclined surfaces P of the recesses 28, 38c can not only be used as a position guide for the subsequent half-cutting process for forming the second openings 282, but also used to increase the distance L between the bonding layer 25 of the adjacent electronic elements, thereby preventing the bonding layer 25 from completely covering the recesses 28, 38c.

Furthermore, since the bonding layer 25 does not completely cover the recesses 28, 38c, the electronic elements 21 after being connected to one another can maintain a preferred flexibility. Also, even if the bonding layer 25 is connected and combined into a large-area sheet body and completely covers the recesses 38a, 38b, since air chambers "a" still exist in the spacing structures 29, 39b, the electronic elements 21 after being connected to one another still have the required flexibility.

In addition, since the spacing structures 29, 39b, 39c remain on the side surfaces 21c of the electronic elements 21 after the recesses 28, 38a, 38b, 38c are formed, the present disclosure prevents delamination of the filling material 23 from occurring between the electronic elements 21 and the carrier structure 20.

The present disclosure further provides an electronic package 2, 4, 5, which includes a plurality of electronic elements 21, at least one spacing structures 29, 39b, 39c, 59 connecting the electronic elements 21, and a plurality of conductive elements 24 electrically connected to the plurality of electronic elements 21 and serving as external contacts.

The spacing structures 29, 39b, 39c, 59 are formed at least between adjacent two of the plurality of electronic elements 21, so as to let the spacing structures 29, 39b, 39c, 59 to connect between the adjacent electronic elements 21, wherein the spacing structures 29, 39b, 39c, 59 have recesses 28, 38a, 38b, 38c, 58.

In an embodiment, the electronic package 2, 4 further has a carrier structure 20, 40 carrying and electrically connected to the plurality of electronic elements 21, wherein the carrier structure 20, 40 has two opposite sides, the plurality of electronic elements 21 are disposed on one of the two opposite sides of the carrier structure 20, 40, and the plurality of conductive elements 24 are disposed on the other one of the two opposite sides of the carrier structure 20, 40. As such, the plurality of conductive elements 24 are electrically connected to the plurality of electronic elements 21 through the carrier structure 20, 40. For example, the carrier structure 20 is in the form of multiple carrier boards, and the carrier structure 40 is in the form of a single carrier board. Further, a filling material 23 is formed between the plurality of electronic elements 21 and the carrier structure 20, 40, and the filling material 23 further constitutes the spacing structures 29, 39b.

In an embodiment, the electronic package 2, 4, 5 further has an encapsulant 22 encapsulating the plurality of electronic elements 21, and the encapsulant 22 further constitutes the spacing structures 29, 39c, 59.

In an embodiment, each of the electronic elements 21 has an active surface 21a, an inactive surface 21b opposite to the active surface 21a, and a side surface 21c adjacent to and connecting the active surface 21a and the inactive surface 21b, and the spacing structures 29, 39b, 39c, 59 connect the side surfaces 21c of the plurality of electronic elements 21.

In an embodiment, the spacing structure 29 comprises a plurality of materials.

In an embodiment, the walls of the recesses 28, 38c have inclined surfaces P, P'. Further, the inclined surfaces P extend to the electronic elements 21.

In an embodiment, the electronic package 2, 4 5 further includes a heat dissipation element 26, 56 bonded onto the plurality of electronic elements 21 and covering the recesses 28, 38a, 38b, 38c, 58. Further, the heat dissipation element 26, 56 is bonded onto the plurality of electronic elements 21 through a bonding layer 25. For example, the bonding layer 25 is partially filled in the recesses 28, 38a, 38b, 38c, 58.

In an embodiment, the conductive elements 24 of the electronic package 5 are in direct electrical connection with the plurality of electronic elements 21.

According to the electronic package and fabrication method thereof of the present disclosure, the design of the recesses of the spacing structures facilitates to improve the flexibility of the electronic elements after the electronic elements are connected to one another. Therefore, the present disclosure can compensate for thermal variation in subsequent packaging processes and prevent warpage so as to improve the reliability of the electronic package.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a plurality of electronic elements;
    a spacing structure formed between and connecting any adjacent two of the plurality of electronic elements;
    a filling material formed between the adjacent two of the plurality of electronic elements, wherein the filling material is in contact with opposing side surfaces of the adjacent two of the plurality of electronic elements, and a first recess is formed within the filling material;
    an encapsulant formed in the first recess, and a second recess formed within the encapsulant; and
    a plurality of conductive elements electrically connected to the plurality of electronic elements and serving as external contacts,
    wherein the lifting material and the encapsulant constitute the spacing structure.

2. The electronic package of claim 1, further comprising a carrier structure carrying and electrically connected to the plurality of electronic elements, wherein the carrier structure has two opposite sides, and wherein the plurality of electronic elements are disposed on one of the two opposite sides of the carrier structure, and the plurality of conductive elements are disposed on the other one of the two opposite sides of the carrier structure.

3. The electronic package of claim 2, wherein the carrier structure is in a form of a single carrier board or in a form of multiple carrier boards.

4. The electronic package of claim 2, wherein the filling material is formed between the plurality of electronic elements and the carrier structure.

5. The electronic package of claim 1, wherein the encapsulant further encapsulates the plurality of electronic elements.

6. The electronic package of claim 1, wherein each of the electronic elements has an active surface, an inactive surface opposite to the active surface, and the side surface adjacent to and connecting the active surface and the inactive surface, and the spacing structure connects the side surfaces of the plurality of electronic elements.

7. The electronic package of claim 1, wherein the second recess has an inclined surface formed on a top wall thereof.

8. The electronic package of claim 7, wherein the inclined surface extends to the adjacent two of the electronic elements.

9. The electronic package of claim 1, further comprising a heat dissipation element bonded onto the plurality of electronic elements and covering the second recess.

10. The electronic package of claim 9, wherein the heat dissipation element is bonded onto the plurality of electronic elements through a bonding layer.

11. The electronic package of claim 10, wherein the bonding layer is partially filled in the second recess.

* * * * *